United States Patent
Son et al.

(10) Patent No.: US 6,984,535 B2
(45) Date of Patent: Jan. 10, 2006

(54) SELECTIVE ETCHING OF A PROTECTIVE LAYER TO FORM A CATALYST LAYER FOR AN ELECTRON-EMITTING DEVICE

(75) Inventors: Jong Woo Son, San Jose, CA (US); Chul Ha Chang, San Jose, CA (US); Jung-Jae Kim, San Jose, CA (US); Koji Suzuki, Haguri-gun (JP); Takashi Kuwahara, Ogaki (JP)

(73) Assignee: cDream Corporation, San Jose, CA (US)

( * ) Notice: Subject to any disclaimer, the term of this patent is extended or adjusted under 35 U.S.C. 154(b) by 123 days.

(21) Appl. No.: 10/327,529

(22) Filed: Dec. 20, 2002

(65) Prior Publication Data

US 2004/0161929 A1    Aug. 19, 2004

(51) Int. Cl.
*H01L 21/302*    (2006.01)

(52) U.S. Cl. .................. 438/20; 438/706; 438/710; 438/712; 438/720; 438/745; 438/750

(58) Field of Classification Search ............... 438/706, 438/710, 712, 720, 745, 750, 20, 725
See application file for complete search history.

(56) References Cited

U.S. PATENT DOCUMENTS

| | | | |
|---|---|---|---|
| 5,828,163 A | 10/1998 | Jones et al. | |
| 5,831,378 A | 11/1998 | Rolfson et al. | |
| 5,973,444 A | 10/1999 | Xu et al. | |
| 6,062,931 A | 5/2000 | Chuang et al. | |
| 6,133,678 A | 10/2000 | Kishino et al. | |
| 6,144,144 A | 11/2000 | Cleeves et al. | |
| 6,204,597 B1 | 3/2001 | Xie et al. | |
| 6,291,356 B1 | 9/2001 | Ionov et al. | |
| 6,325,909 B1 | 12/2001 | Li et al. | |
| 6,339,281 B2 | 1/2002 | Lee et al. | |
| 6,515,415 B1 | 2/2003 | Han et al. | |
| 6,741,026 B2 * | 5/2004 | Han et al. .................. 313/495 |
| 2002/0079802 A1 | 6/2002 | Inoue et al. | |

OTHER PUBLICATIONS

Search Report PCT/US03/40794.

* cited by examiner

*Primary Examiner*—George A. Goudreau
(74) *Attorney, Agent, or Firm*—Fenwick & West LLP (57) ABSTRACT

An electron-emitting device including a protective layer that is formed on a catalyst layer to protect the catalyst layer from the deleterious environmental conditions before or during a cathode process. The present invention further includes a half etching process that is adapted to partially remove portions of the protective layer from the catalyst layer to etch the catalyst layer except carbon nano-tube growing portions. Portions of the protective layer still remain on the catalyst layer to protect the catalyst layer from the deleterious conditions from next cathode formation process.

20 Claims, 10 Drawing Sheets

Prior Art Diagram

FIG 1

Prior Art Diagram

240: Damaged Catalyst during Cathode process

FIG 2

Prior Art Diagram

310: Poor CNT caused by damaged Catalyst 240

FIG 3

Present Art Diagram

Present Art Diagram

Present Art Diagram

FIG 6

Present Art Diagram

FIG 7

Present Art Diagram

Present Art Diagram

Present Art Diagram

510: No damaged Catalyst
1000: Good CNT

FIG 10

SELECTIVE ETCHING OF A PROTECTIVE LAYER TO FORM A CATALYST LAYER FOR AN ELECTRON-EMITTING DEVICE

FIELD OF USE

This invention relates to carbon nano tube based field emitters display. More particularly, this invention relates to the structure and fabrication of an electron-emitting device in which a protective layer is selectively etched during the formation of a catalyst layer which is suitable for use in a flat-panel display of the cathode-ray tube ("CRT") type.

BACKGROUND

A Cathode Ray Tube (CRT) display generally provides the best brightness, highest contrast, best color quality and largest viewing angle of prior art computer displays. CRT displays typically use a layer of phosphor which is deposited on a thin glass faceplate. These CRTs generate a picture by using one to three electron beams which generate high energy electrons that are scanned across the phosphor in a raster pattern.

The phosphor converts the electron energy into visible light so as to form the desired picture. However, prior art CRT displays are large and bulky due to the large vacuum envelopes that enclose the cathode and extend from the cathode to the faceplate of the display. Therefore, typically, other types of display technologies such as active matrix liquid crystal display, plasma display and electro-luminescent display technologies have been used in the past to form thin displays.

Recently, a thin flat panel display (FPD) has been developed which uses the same process for generating pictures as is used in CRT devices. These flat panel displays use a backplate including a matrix structure of rows and columns of electrodes. One such flat panel display is described in U.S. Pat. No. 5,541,473 which is incorporated herein by reference. Flat panel displays are typically matrix-addressed and they comprise matrix addressing electrodes. The intersection of each row line and each column line in the matrix defines a pixel, the smallest addressable element in an electronic display.

The essence of electronic displays is the ability to turn on and off individually picture elements (pixels). A typical high information content display will have about a quarter million pixels in a 33 cm diagonal orthogonal array, each under individual control by the electronics. The pixel resolution is normally just at or below the resolving power of the eye. Thus, a good quality picture can be created from a pattern of activated pixels.

One means for generating arrays of field emission cathode structures relies on well established semiconductor microfabrication techniques. These techniques produce highly regular arrays of precisely shaped field emission tips. Lithography, generally used in these techniques, involves numerous processing steps, many of them wet. The number of tips per unit area, the size of the tips, and their spacing are determined by the available photo-resist and the exposing radiation.

Emitter tips produced by the method are typically coneshaped with base diameters on the order of 0.5 to 1 um, heights of anywhere from 0.5 to 2 um, tip radii of tens of nano-meters. This size limits the number of tips per pixel possible for high resolution displays, where large numbers (400–1000 emitters per pixel) are desirable for uniform emission to provide adequate gray levels, and to reduce the current density per tip for stability and long lifetimes. Maintaining two dimensional registry of the periodic tip arrays over large areas, such as large TV-sized screens, can also be a problem for gated field emission constructions by conventional means, resulting in poor yields and high costs.

U.S. Pat. No. 4,338,164 describes a method of preparing planar surfaces having a micro-structured protuberances thereon comprising a complicated series of steps involving irradiation of a soluble matrix (e.g., mica) with high energy ions, as from a heavy ion accelerator, to provide column-like traces in the matrix that are subsequently etched away to be later filled with an appropriate conductive, electron-emitting material. The original soluble material is then dissolved following additional metal deposition steps that provide a conductive substrate for the electron emitting material. The method is said to produce up to $10^6$ emitters per cm2, the emitters having a diameter of approximately 1–2 um.

U.S. Pat. No. 5,266,530 describes a gated electron field emitter prepared by a complicated series of deposition and etching steps on a substrate, preferably crystalline.

Carbon, the most important constituent element, which is combined with oxygen, hydrogen, nitrogen and the like, of all organisms including the human body, has four unique crystalline structures including diamond, graphite and carbon. Carbon nano-tubes can function as either a conductor or a semi-conductor according to the constituents of the tube. A conventional approach of fabricating carbon nanotubes is described in an article entitled "epitaxial carbon nanotube film self-organized by sublimation decomposition of silicon carbide" (Appl. Phys. Lett. Vol. 77, pp. 2620, 1997), by Michiko Kusunoky. In the conventional approach, the carbon nano-tubes are produced at high temperatures by irradiating a laser onto a graphite silicon carbide. In this particular approach, the carbon nano-tubes are produced from graphite at about 1200° C. or more and for silicon carbide at a temperature range of about 1600° C. to 1700° C. However, this method requires a multi-stage approach of deposition of the carbon material. This method is, from a manufacturing perspective, costly and cumbersome.

Another conventional approach is to grow the carbon nano-tubes on a silicon substrate. This approach requires that the carbon nano-tube material be deposited at temperature higher than 700° C. to ensure a purified and defect-free vertically aligned carbon nano-tube structure.

Any attempt to grow the carbon nano-tube structure at temperatures on the contaminated catalyst results in a defective structure. This conventional approach also results in the inability to control the height of the carbon structure.

Figure 1:
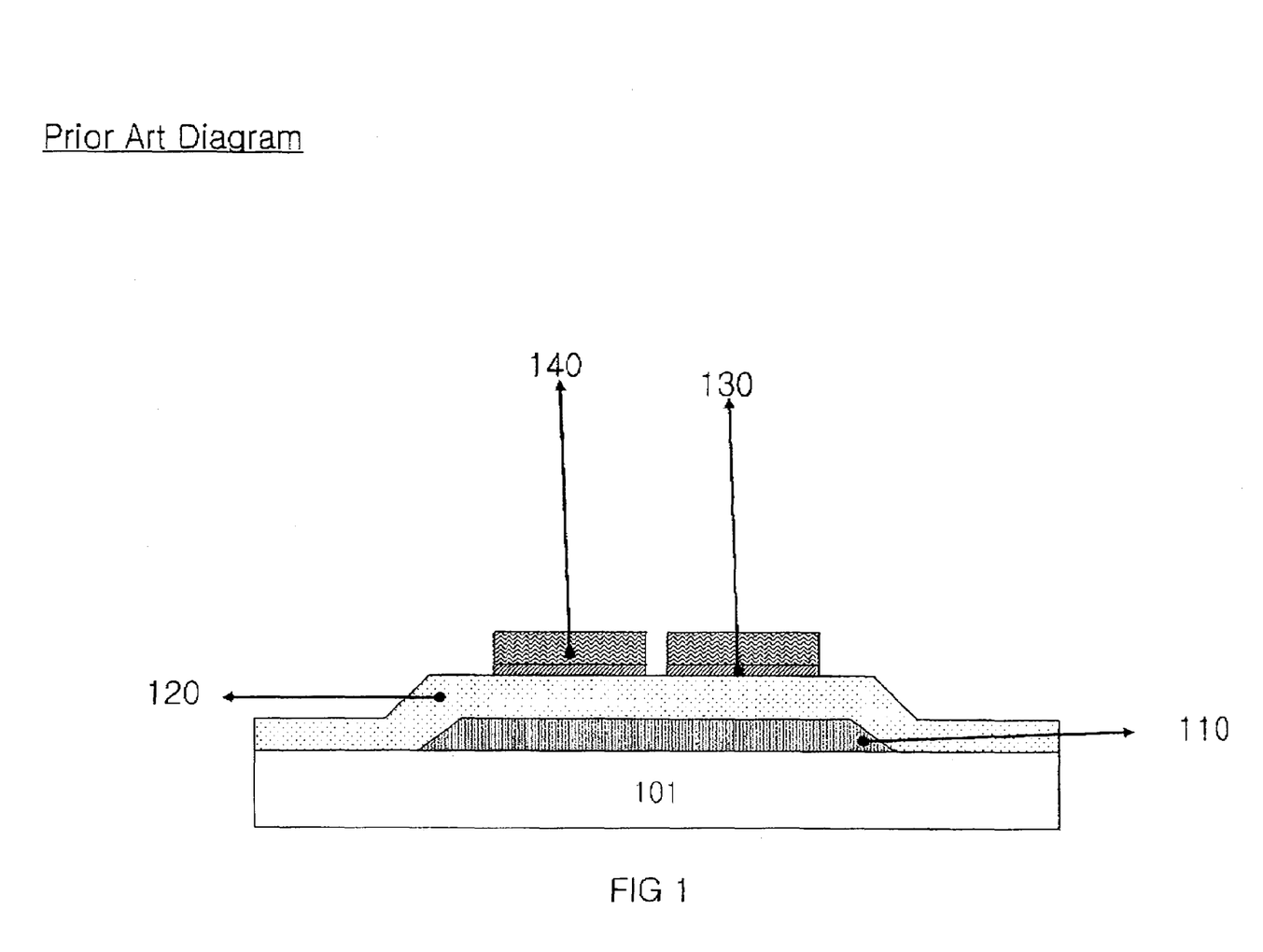
FIG. 1 is a cross-sectional view of a prior art patterned catalyst layer structure.
Figure 2:
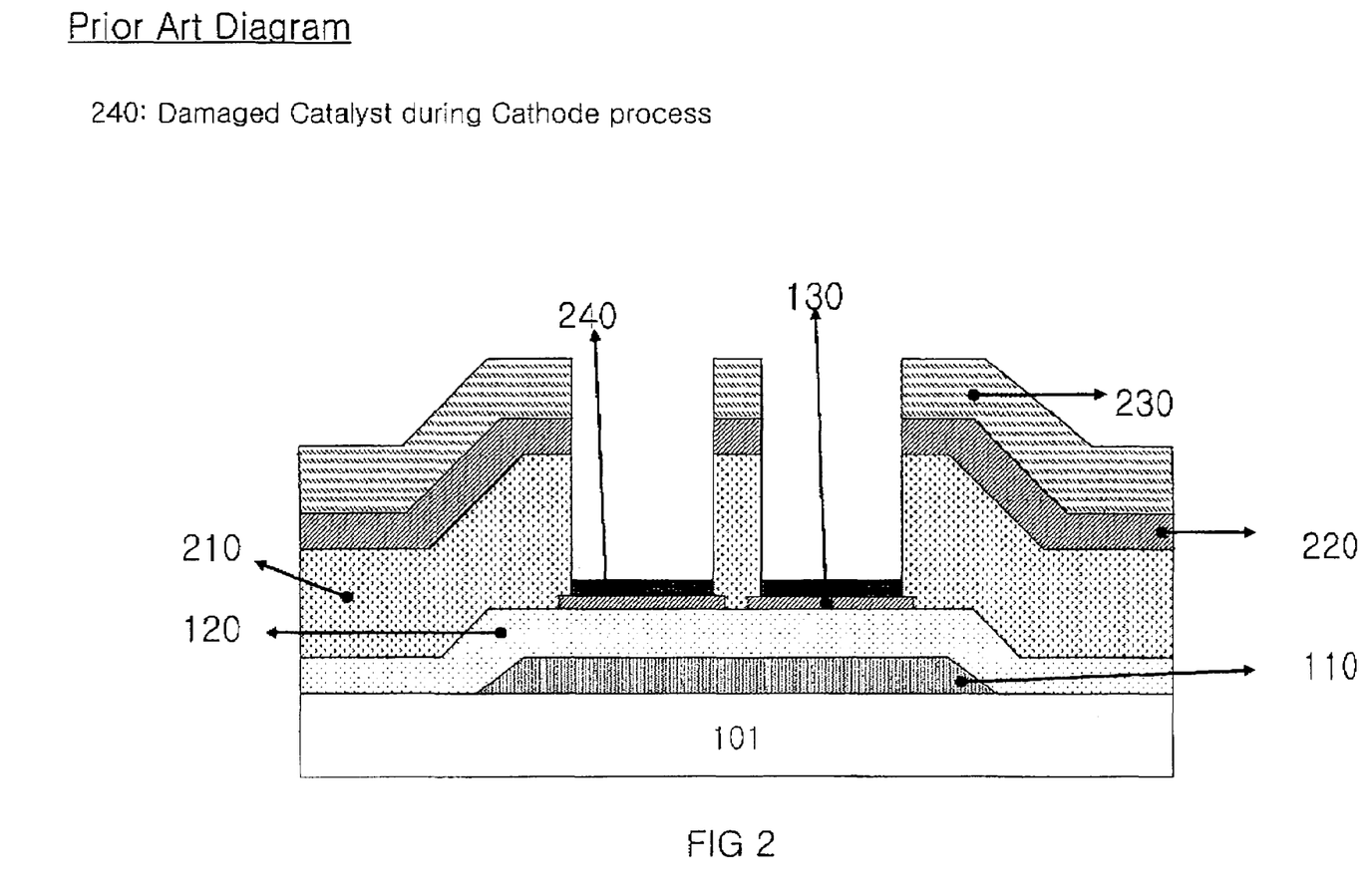
FIG. 2 is a cross-sectional structural view of a prior art carbon nano-tube structure with a damage catalyst layer in a cathode structure.
Figure 3:
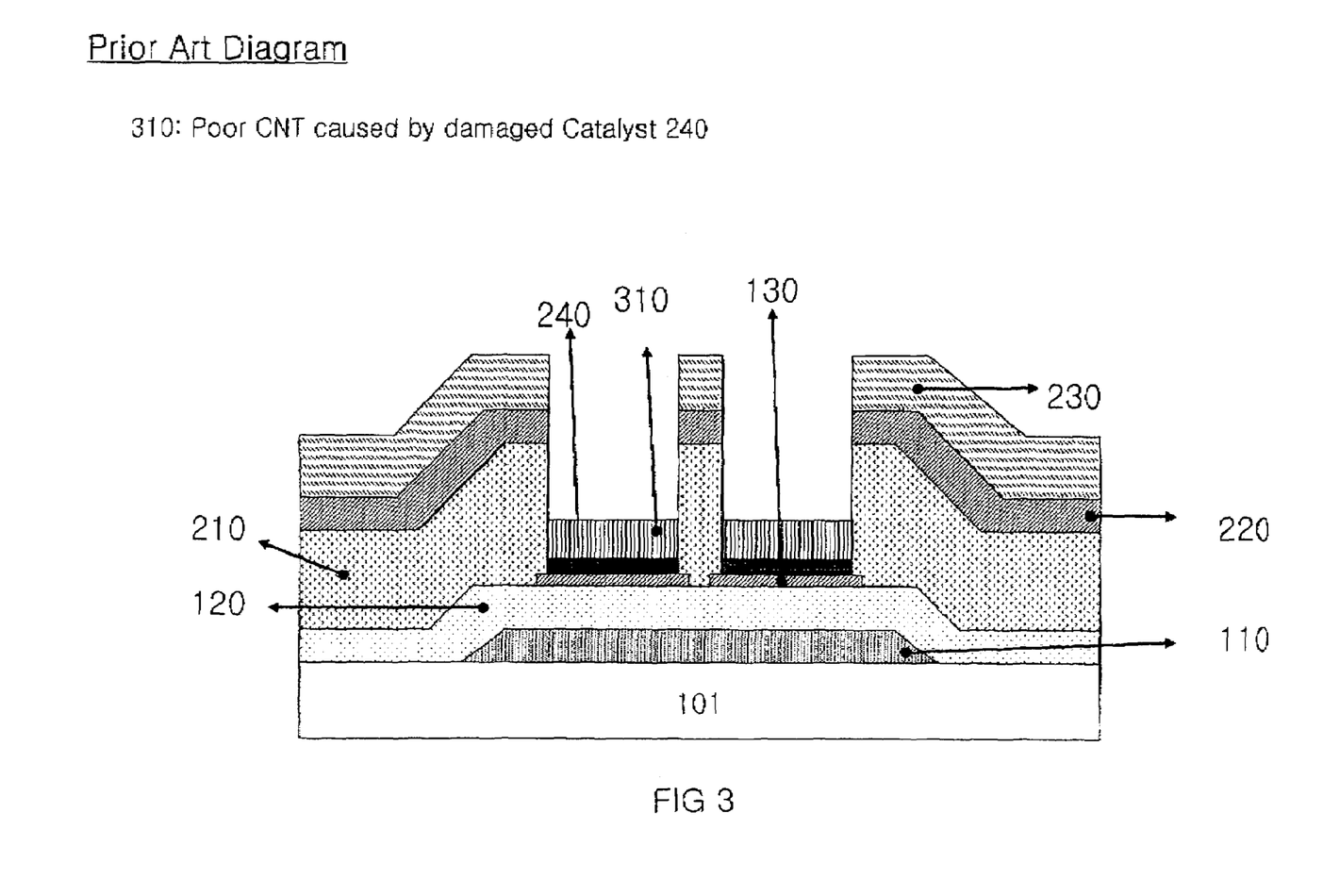
FIG. 3 is cross-sectional view a prior art carbon nano-tube device.

FIG. 3 is an illustration of a prior art carbon nano-tube structure. The carbon nano-tube structure shown in FIG. 3 comprises a substrate 101 with a catalyst metal layer 240 upon which carbon nano-tube layer 310 is deposited. The catalyst layer 240 diffuses into the silicon layer 120 during the growing of the carbon nano-tube layer 310. The carbon nano-tube layer 310 is grown by a plasma deposition and etching method at temperatures ranging from 500° C. to 900° C. The plasma density in this approach ranges from a high density of $10^{11}$ $cm^3$ or more. In the structure in FIG. 3, the diffusion of the catalyst layer 240 into the silicon layer 11 results in a high amount of carbon material being deposited to form the nano-tube structure.

The catalyst layer 240 is provided to facilitate the uniform growth of the carbon nano-tubes. For non-defective carbon nano-tube formation, the conditions of the catalyst layer, such as the materials, the thickness, uniformity and surface conditions of the catalyst layer are very important. In the prior art method of growing the carbon nano-tubes, the catalyst layer is typically exposed to the chemicals and gas process that are used to fabricate the cathode prior to growing the carbon nano-tubes. This deleteriously affects the catalyst layer and could result in the contamination of the catalyst layer prior to the formation of the carbon nano-tubes. Having a contaminated catalyst layer also results in the poor growing of the carbon nano-tubes.

A method of forming a catalyst layer that has not been exposed to the deleterious conditions of the prior art is thus needed to promote the quality growth of carbon nano-tube.

GENERAL DISCLOSURE OF THE INVENTION

The present invention furnishes an electron-emitting device having a catalyst layer patterned to meet enable the growth and curing of carbon nano-tube structures on glass substrates. The present catalyst layer contains multiple laterally separated sections situated between electron emitting carbon nano-tube, on one hand, and underlying emitter electrodes, on the other hand. The present invention provides a catalyst layer that is formed in a way to reduce the deleterious effects that growing the carbon nano-tubes provide. The sections of the catalyst layer are spaced apart along each emitter electrode.

The catalyst sections underlie gate holes of the present electron-emitting device in various ways. In one general embodiment, the catalyst sections are basically configured as strips situated below the carbon nano-tubes.

In another general embodiment of the catalyst layers are formed on a glass substrate and the carbon nano-tubes are formed on the catalyst layer at a temperature of about 600°. An anti-diffusion barrier layer is also interlaced between the catalyst layer and other layers including a resistive layer in order to ensure a defect-free carbon nano-tube formation.

Embodiments of the present invention include a protective layer that is formed on the catalyst layer to protect the catalyst layer from the deleterious environmental conditions before or during the next cathode process.

Embodiments of the carbon nano-tubes structure of the present invention use sputtering process to deposit the catalyst layer on the glass substrate. The catalyst layer may also be deposited by an evaporation process. A post growth treatment of the carbon nano-tube structure is further performed to control the height of the structures in a plasma chemical vapor deposition environment.

Embodiments of the present invention further include a half etching process that is adapted to partially remove portions of the protective layer from the catalyst layer to etch catalyst layer except carbon nano-tube growing portions. Portions of the protective layer still remain on the catalyst layer to protect the catalyst layer from the deleterious conditions from next cathode formation process.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

Like reference symbols are employed in the drawings and in the description of the preferred embodiments to represent the same, or very similar, item or items.

DESCRIPTION OF THE PREFERRED EMBODIMENTS

In the present invention, a vertical conductor connected in series with electron-emissive elements of an electron-emitting device is patterned into multiple sections laterally separated along each emitter electrode in the device. The electron emitter of the invention typically operates according to field-emission principles in producing electrons that cause visible light to be emitted from corresponding light-emissive phosphor elements of a light-emitting device. The combination of the electron-emitting device, often referred to as a field emitter, and the light-emitting device forms a cathode-ray tube of a flat-panel display such as a flat-panel television or a flat-panel video monitor for a personal computer, a lap-top computer, or a workstation.

In the following description, the term "electrically insulating" (or "dielectric") generally applies to materials having a resistivity greater than $10^{10}$ ohm-cm. The term "electrically non-insulating" thus refers to materials having a resistivity below $10^{10}$ ohm-cm. Electrically non-insulating materials are divided into (a) electrically conductive materials for which the resistivity is less than 1 ohm-cm and (b) electrically resistive materials for which the resistivity is in the range of 1 ohm-cm to $10^{10}$ ohm-cm. These categories are determined at an electric field of no more than 1 volt/$\mu$m.

Examples of electrically conductive materials (or electrical conductors) are metals, metal-semiconductor compounds (such as metal silicides), and metal-semiconductor eutectics. Electrically conductive materials also include semiconductors doped (n-type or p-type) to a moderate or high level. The semiconductors may be of the mono-crystalline, multi-crystalline, polycrystalline, or amorphous type.

Electrically resistive materials include (a) metal-insulator composites such as cermet, (b) certain silicon-carbon compounds such as silicon carbide and silicon-carbon-nitrogen, (c) forms of carbon such as graphite, amorphous carbon, and modified (e.g., doped or laser-modified) diamond, and (d) semiconductor-ceramic composites. Further examples of electrically resistive materials are intrinsic and lightly doped (n-type or p-type) semiconductors.

As used below, an upright trapezoid is a trapezoid whose base (a) extends perpendicular to the direction taken as the vertical, (b) extends parallel to the top side, and (c) is longer than the top side. A transverse profile is a vertical cross section through a plane perpendicular to the length of an elongated region. The row direction in a matrix-addressed field emitter for a flat-panel display is the direction in which the rows of picture elements (pixels) extend. The column direction is the direction in which the columns of pixels extend and runs perpendicular to the row direction.

Figure 4:
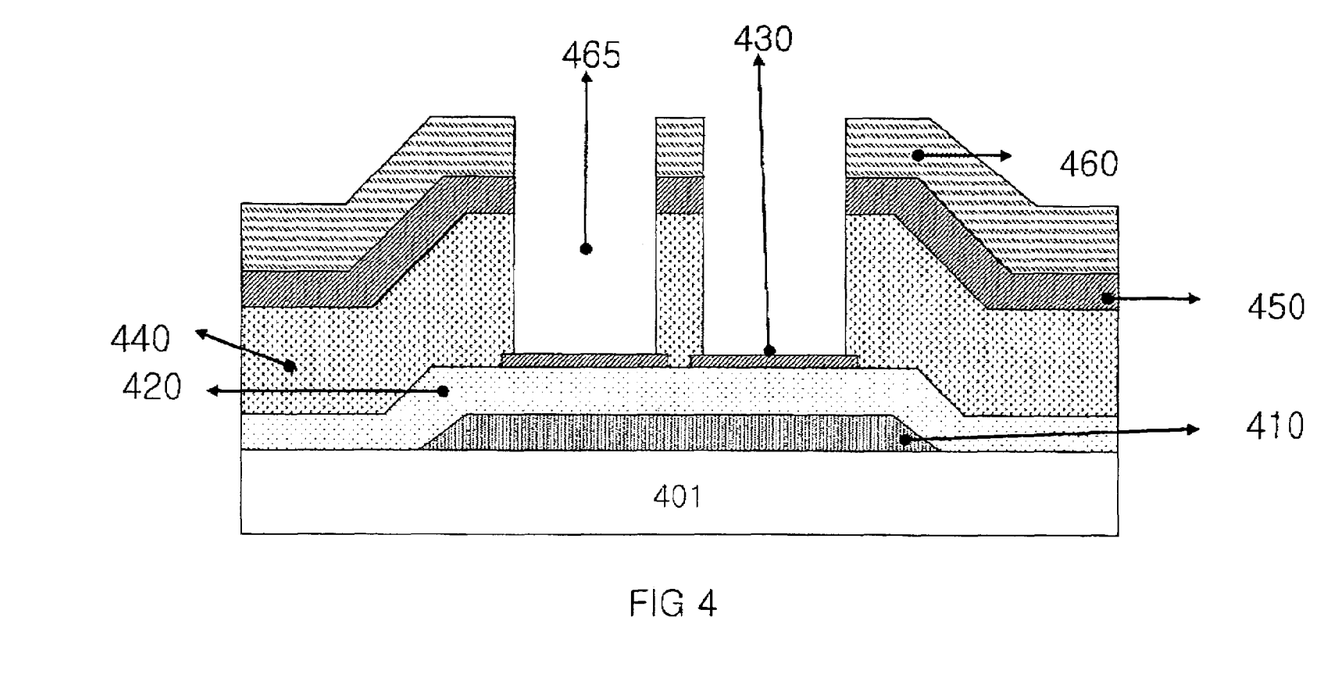
FIG. 4 is cross-sectional structural view representing a step in manufacturing an embodiment of the carbon nano-tube device in accordance with the teachings of the present invention.

Referring to FIG. 4, a substrate 401 for use in the formation of the carbon nano-tubes according to an embodiment of the present invention is shown. An emitter electrode 410 is formed on the substrate 401. In the preferred embodiment of the present invention, the substrate 401 is glass. In one embodiment of the present invention, the substrate 401 is ceramic, silicon or quartz.

A resistor layer 420 is subsequently disposed on the emitter electrode 410. The resistor layer 420 provides the carbon nanotube that are formed in the structure 400 uniform emission characteristics. A barrier layer 430 is subsequently formed on the resistor layer 420 and serves as an anti-diffusion layer for the catalyst layer upon which the carbon nano-tubes are formed. In one embodiment of the present invention, the barrier layer 430 may be formed of a metal.

In one embodiment, the metal may be molybdenum. In another embodiment, the metal may be titanium or titanium tungsten or titanium nitride. In one embodiment of the present invention, the barrier layer 430 may be an alloy of titanium, titanium tungsten, tungsten, titanium nitride or molybdenum. After the formation of the barrier layer 430, the resistor layer 420, an insulator layer 440, gate electrode 450 and a passivation layer 460, a gate hole is etched through these layers to form a gate hole through which the carbon nano-tubes are formed.

Figure 5:
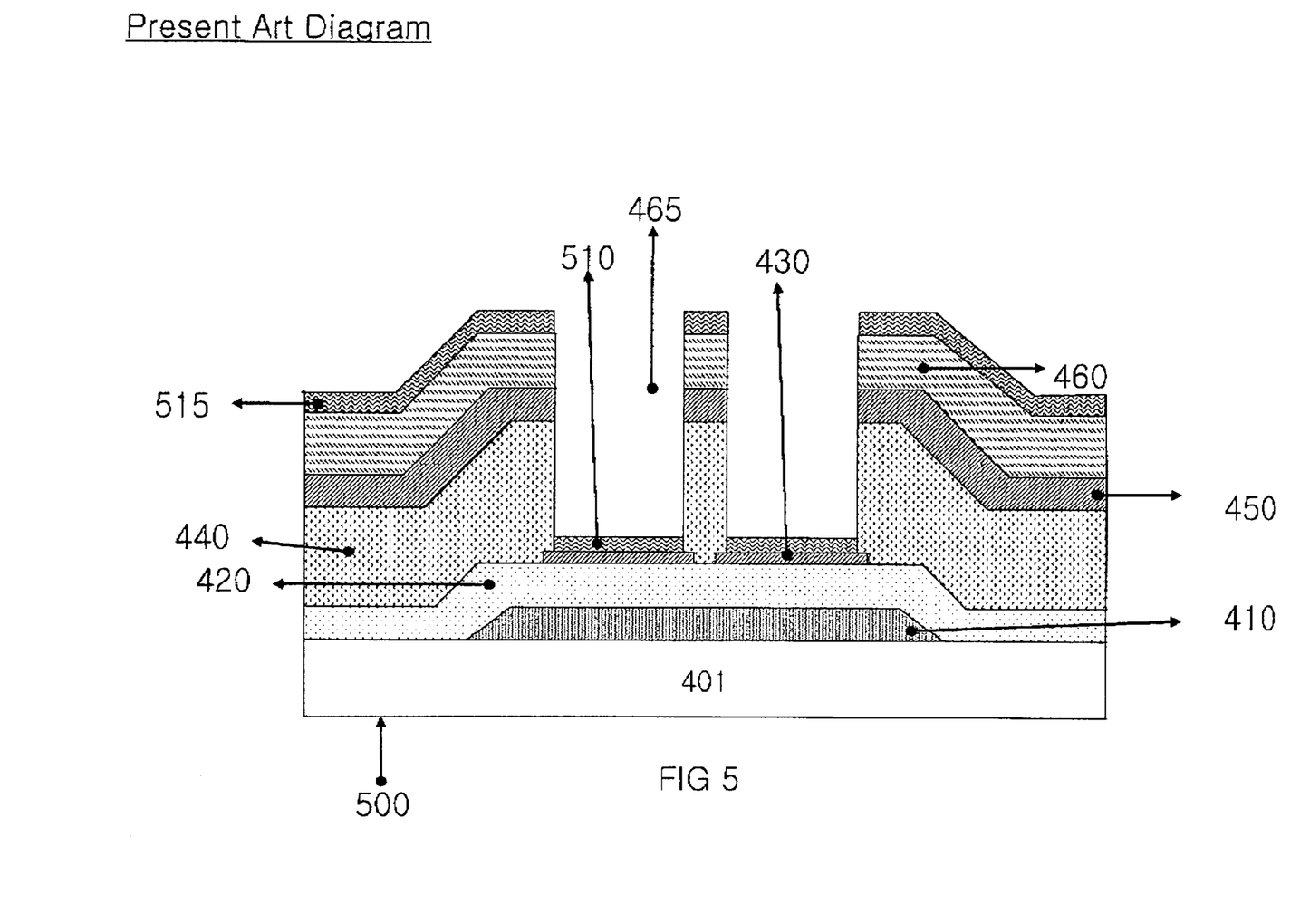
FIG. 5 is a cross-sectional structural view of one embodiment of the carbon nano-tube structure after the formation of a catalyst layer.

A catalyst layer 510 and 515 is subsequently formed over the barrier layer 430 as shown in FIG. 5. In one embodiment of the present invention, the catalyst layer 510 and 515 is formed by a sputtering deposition process. In one embodiment of the present invention, the catalyst layer 510 and 515 may be formed by an evaporation process. In one embodiment of the present invention, the catalyst layer 510 is deposited to a thickness of about 1 nm to 100 nm. In one embodiment of the present invention, the catalyst layer 510 may be made of Nickel or an alloy thereof. In one embodiment, the catalyst layer may be cobalt or iron or alloys thereof.

Figure 6:
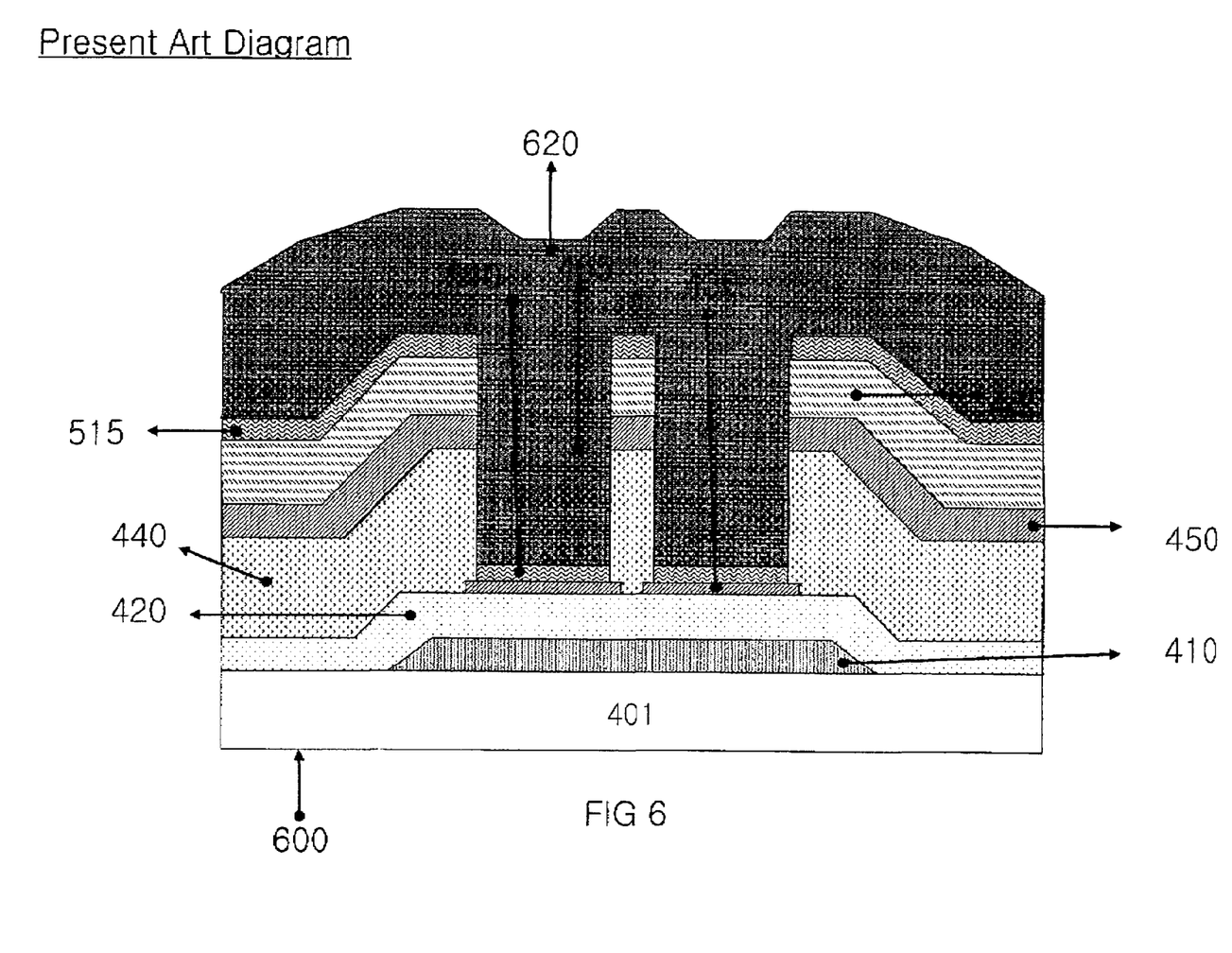
FIG. 6 is a cross-sectional structural view of one embodiment of a carbon nano-tube structure with a protective layer in accordance with the teachings of the present invention.

In FIG. 6, a structure 600 is formed by the deposition, a protective layer 620 is formed by depositing a photo-resist material over the exposed layers in structure 500 and gate hole 465, in one embodiment, by a self aligning normal deposition, as opposed to an angle of evaporation, whereby the protective material fills the gate hole 465 and covers the catalyst layer 510. In one embodiment of the present invention, the protective material possesses etching characteristics incompatible with the etching characteristics of the catalyst layer 510 and 515. In one embodiment of the present invention, the protective layer 620 may be coated over the catalyst layer 510 and the exposed layers of structure 500.

After the deposition of the protective material 620, a half etching process is applied to remove portions of the protective material from the exposed layers of structure 600. In one embodiment of the present invention, all of the protective material is removed except in the gate hole where some of the protective material is left to protect the catalyst layer 510 during the catalyst layer 515 removal step. In one embodiment of the present invention, the protective material 620 remains in the gate hole 465 to cover and protect the catalyst layer 510 from subsequent etching steps of the structure 600. The protective material 620 remains in the gate hole 465 because the depth of the protective material in the gate hole 465 is deeper than the depth of the protective material covering the exposed layers of the structure 600.

After partially etching the protective layer 620, the catalyst layer 515 is exposed and then etched by either a dry etching process or a wet etching process. In one embodiment of the present invention, if a Ni catalyst layer material is used, the etchant to partially remove the catalyst layer 515 may comprise of $H_3PO_4$, $HNO_3$ or $CH_3COOH$. In one embodiment of the present invention, a gas etchant is used to partially remove the protective layer 620 from the structure 600. In one embodiment of the present invention, prior to the partial etching of the protective material 620, the etch rate of the protective material is determined in order to determine the amount of time it takes to partially etch the protective material. In one embodiment of the present invention, the protective material may be etched at a rate of 400 sccm of $O_2$ to 5 mins for a protective material with a thickness of about 1.5 um.

Figure 7:
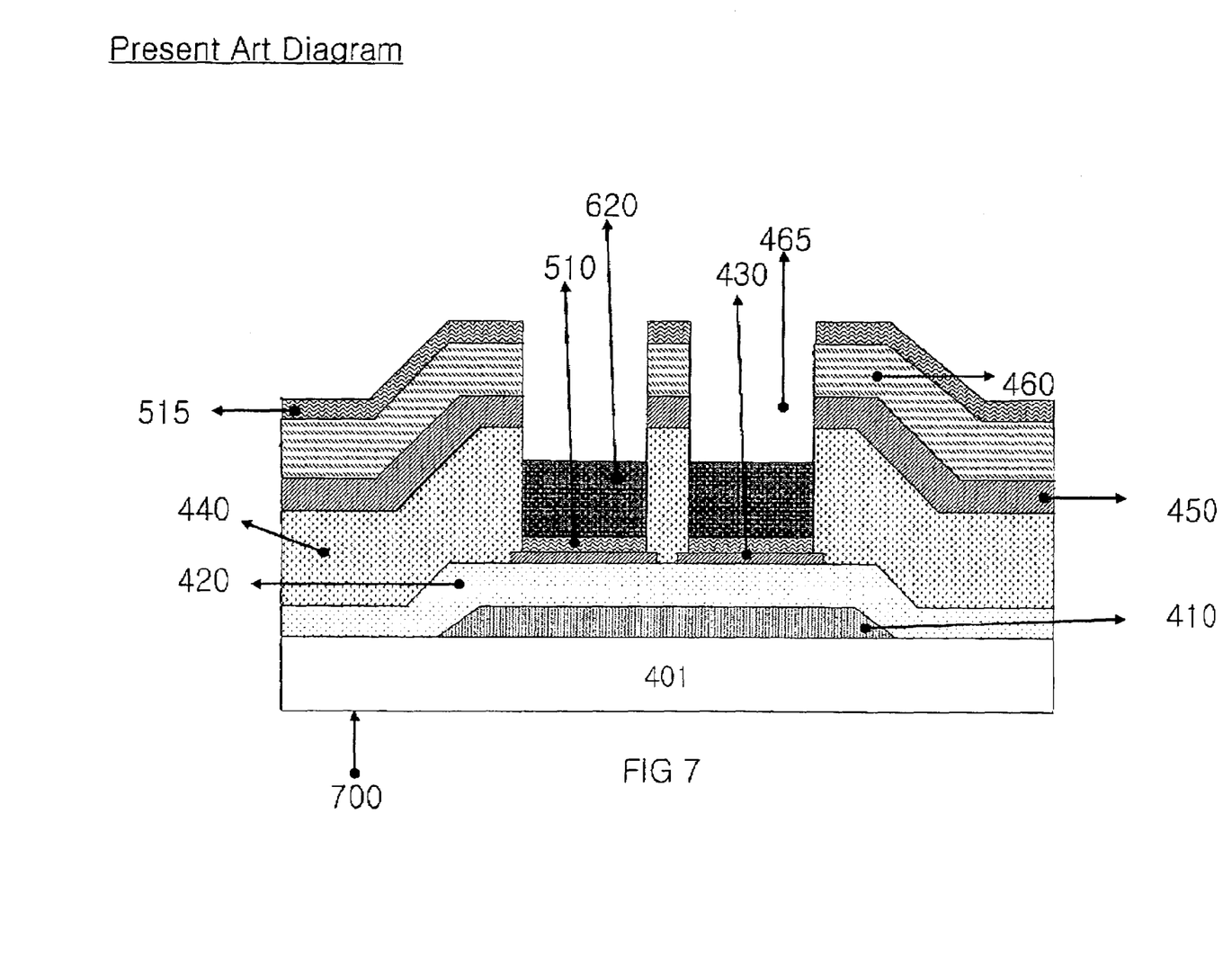
FIG. 7 is a cross-sectional structural view of one embodiment of the partial removal of the protective layer of FIG. 6.
Figure 8:
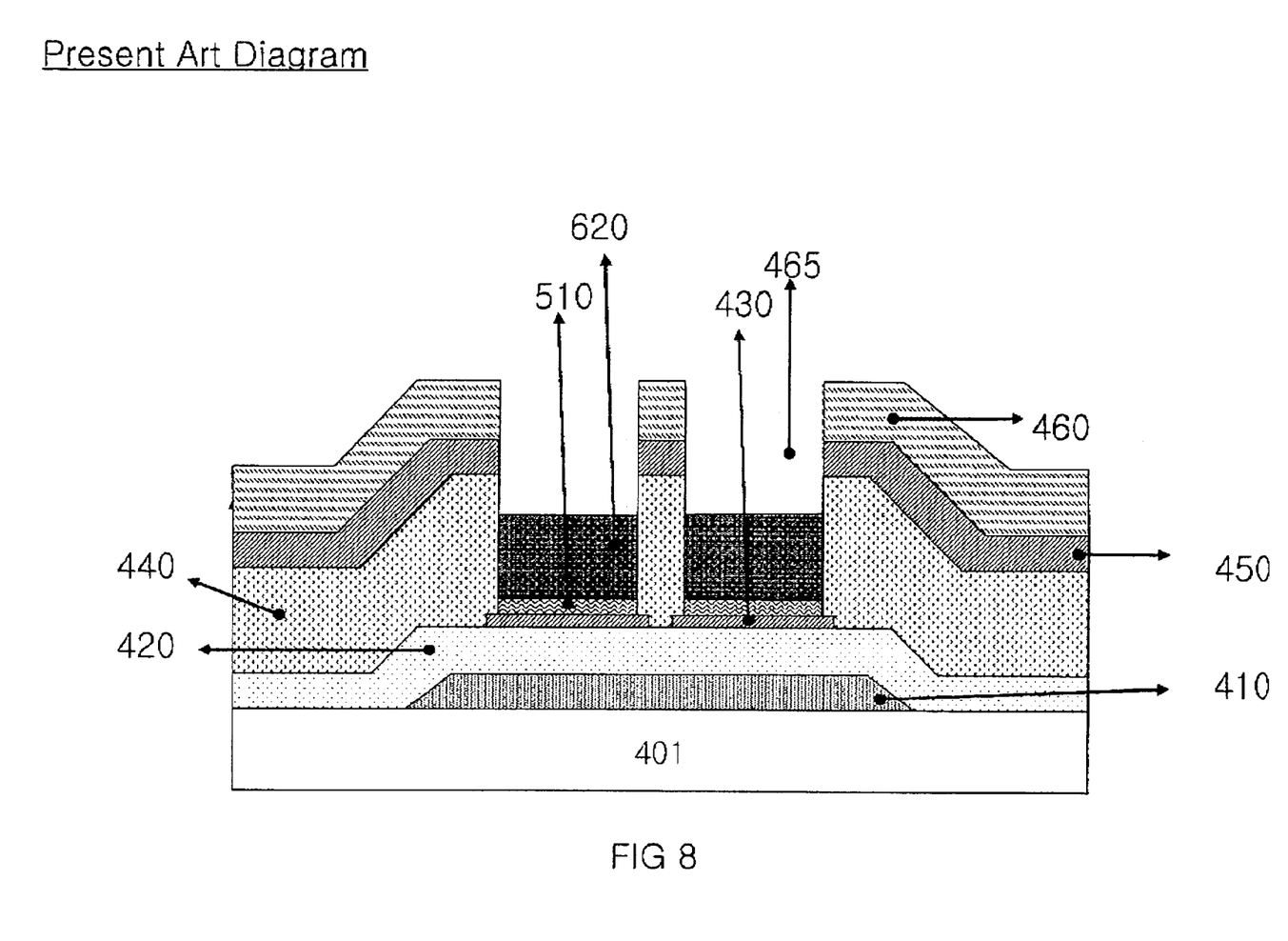
FIG. 8 is a cross-sectional structural view of one embodiment of the removal of excess catalyst material from the top of the carbon nano-tube structure of FIG. 7.

Referring now to FIG. 7, a structure 700 is formed after the partial removal of the protective material. As shown in FIG. 7, portions of the catalyst layer 515 is exposed after the protective material has been partially removed. The catalyst layer 515 is subsequently removed as shown in FIG. 8. Removing of the exposed catalyst layer 515 does not affect the protected catalyst layer 510 which is protected by the portion of the protective material 620 that was not removed from the gate hole 465.

After the excess exposed catalyst layer 515 has been removed by an etching process, the excess protective material 620 is removed through an etching process from the gate hole 465. Etching the excess protective material 620 does not have a deleterious effect on the catalyst layer 510. This is because the etchant used, in one embodiment of the present invention, to remove the excess protective material has no effect on the catalyst layer 510.

Figure 9:
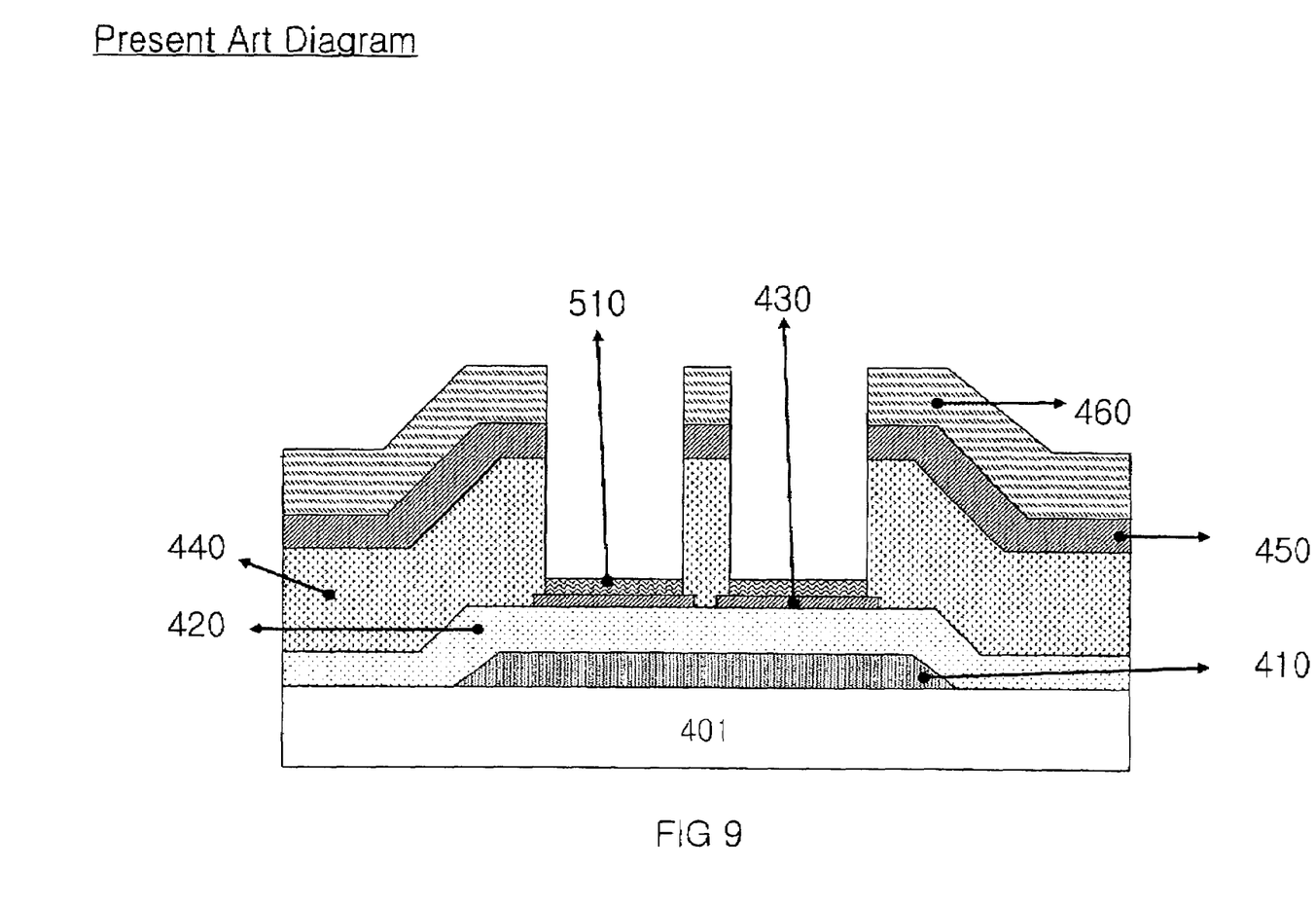
FIG. 9 is a cross-sectional structural view of one embodiment of the excess protective layer material from the top of the catalyst layer in accordance with the teachings of the present invention.
Figure 10:
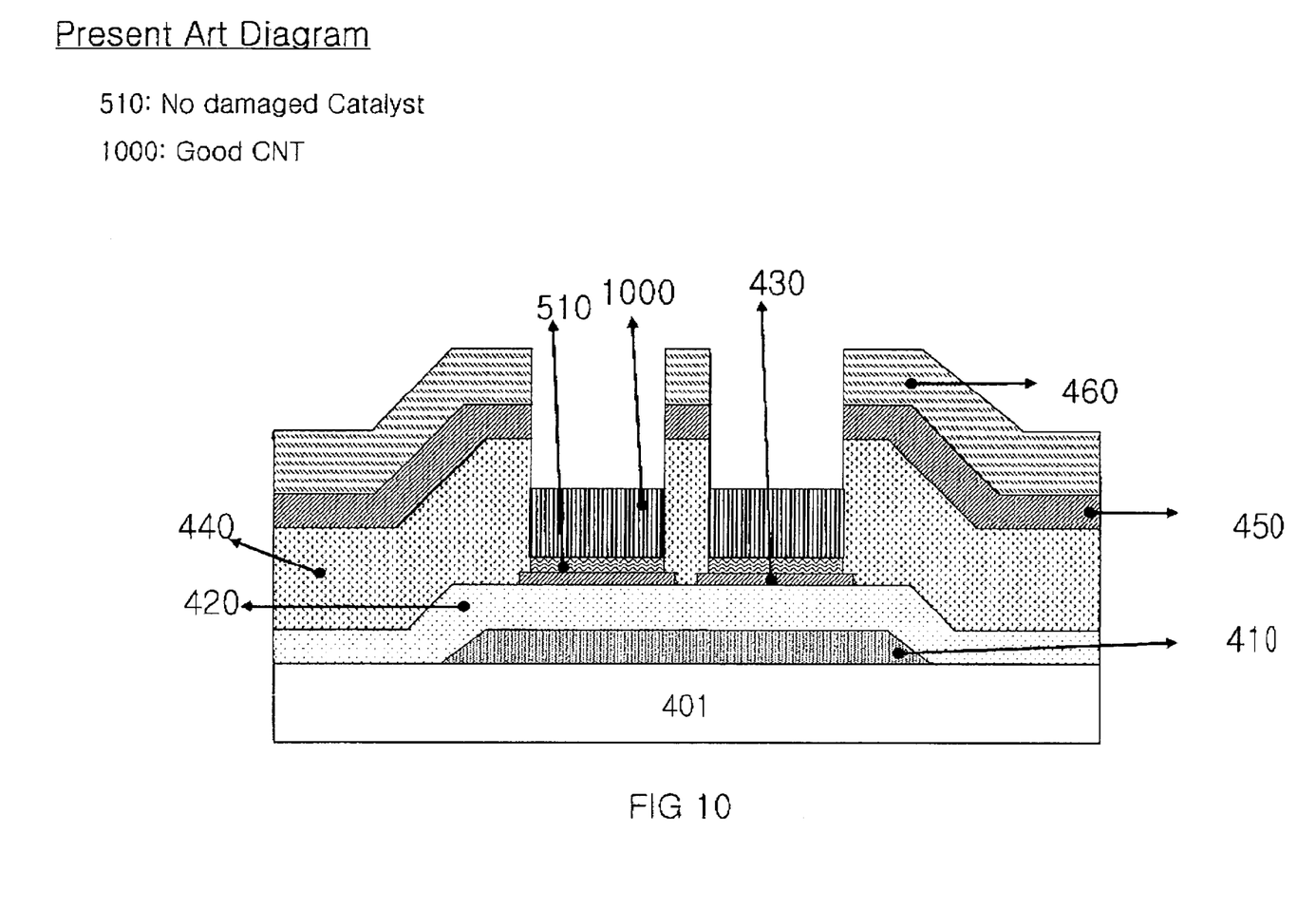
FIG. 10 is a cross-sectional structural view of one embodiment of a carbon nano-tube cathode structure according to the teachings of the present invention.

In one embodiment of the present invention, the etchant used to etch the catalyst layer 510 has good selectively with respect to the surface materials of the protective layer 620 and the catalyst layer 510. After the excess protective material has been etched and the catalyst layer 510 exposed as shown in FIG. 9, the carbon nanotube of the present invention are formed on the catalyst layer 510 as shown in FIG. 10.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications that are suited to the particular use contemplated. It is intended that the scope of the invention be defined by the Claims appended hereto and their equivalent.

We claim:

1. A method for forming a catalyst layer for an electron-emitting device, the method comprising:
    forming a cathode structure on a substrate comprising:

an electrode emitter,
a resistor layer,
a barrier layer,
a catalyst layer,
a dielectric layer,
a gate layer,
a catalyst layer disposed over said gate layer, and
a gate hole;
depositing a protective material over said catalyst layer in said gate hole and on said gate layer; and
partially removing said protective material during a partial etching step to remove said catalyst layer deposited on said gate layer.

2. The method of claim 1 wherein during said partial etching step said protective material in said gate hole is partially removed while a partial layer of said protective material is left to cover said catalyst layer to protect said catalyst layer of the deleterious effect of removing said catalyst layer from said gate layer.

3. The method of claim 2, wherein said partial layer of protective material is subsequently removed from said the top of said catalyst layer prior to a deposition step of depositing carbon material on said catalyst layer.

4. The method of claim 2, wherein said partial etching of said protective material is performed with an etchant with good selectivity with respect to the excess catalyst layer on said gate layer and said catalyst layer in said gate hole.

5. The method of claim 4, wherein said etchant comprises an aluminum etchant.

6. The method of claim 5, wherein said aluminum etchant comprises $H_3PO_4$.

7. The method of claim 5, wherein said aluminum etchant comprises $HNO_3$.

8. The method of claim 5, wherein said aluminum etchant comprises $CH_3COOH$.

9. The method of claim 5, wherein said aluminum etchant comprises.

10. The method of claim 1, wherein said protective material is etched with a dry etching process.

11. The method of claim 1, wherein said protective material is etched by a gas etching process.

12. The method of claim 1, wherein prior to said etching of said protective material, an etching rate of said protective material is determined in order to determine an etching time for said catalyst layer.

13. The method of claim 1, wherein said protective material protects said catalyst layer in said gate hole from chemical damage prior to forming said carbon nano-tubes on said catalyst layer.

14. The method of claim 1, wherein a depth of said protective material covering said catalyst layer is deeper in said gate hole than other parts of the cathode structure.

15. The method of claim 1, wherein said substrate is glass.

16. The method of claim 1, wherein said substrate is ceramic.

17. The method of claim 1, wherein said substrate is a semi-conductor.

18. A method for preparing a cathode for an electron-emitting device, the method comprising:
forming a cathode structure on a substrate, the cathode structure comprising an electrode emitter, a dielectric layer, and a gate layer, at least one gate hole formed through the gate layer and dielectric layer, the cathode structure further including a catalyst layer disposed over the gate layer and in the gate hole;
depositing a protective material over at least a portion of the catalyst layer; and
partially removing the protective material to remove at least a portion of the catalyst layer deposited on the gate layer.

19. The method of claim 18, wherein removing the protective material is performed by etching a portion of the protective material.

20. The method of claim 18, further comprising:
growing a plurality of carbon nanotubes on the cathode structure in the gate hole using the remaining catalyst layer.

* * * * *